(12) United States Patent
Vadi

(10) Patent No.: US 7,233,169 B1
(45) Date of Patent: Jun. 19, 2007

(54) BIDIRECTIONAL REGISTER SEGMENTED DATA BUSING

(75) Inventor: Vasisht Mantra Vadi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 177 days.

(21) Appl. No.: 11/055,475

(22) Filed: Feb. 10, 2005

(51) Int. Cl.
*H03K 19/177* (2006.01)
*G11C 7/10* (2006.01)

(52) U.S. Cl. ................. 326/41; 326/47; 365/189.05

(58) Field of Classification Search ........... 365/189.05; 326/37–41, 47
See application file for complete search history.

(56) References Cited

U.S. PATENT DOCUMENTS 5,717,885 A * 2/1998 Kumar et al. ............... 711/207
5,914,616 A 6/1999 Young et al.

OTHER PUBLICATIONS

U.S. Appl. No. 10/836,722, filed Apr. 30, 2004, Vadi et al.
U.S. Appl. No. 10/683,944, filed Oct. 10, 2003, Young.
U.S. Appl. No. 10/796,750, filed Mar. 8, 2004, Vadi et al.
U.S. Appl. No. 10/970,964, filed Oct. 22, 2004, Vadi et al.
Xilinx, Inc.; "Programmable Logic Data Book 2000"; published Apr. 2000; available from Xilinx, Inc.; 2100 Logic Drive, San Jose, California 95124; pp. 3-75 through 3-96.
Xilinx, Inc.; "Virtex-II Pro Platform FPGA Handbook"; published Dec. 2000; available from Xilinx, Inc., 2100 Logic Drive, San Jose, California 95124; pp. 33-75.
Xilinx, Inc.; "Virtex-II Pro Platform FPGA Handbook"; published Oct. 14, 2002; available from Xilinx, Inc., 2001 Logic Drive, San Jose, California 95124; pp. 19-71.
Xilinx, Inc., "Virtex Series Configuration Architecture User Guide," XAPP151, Mar. 24, 2003, pp. 1-45, (v1.6), available from Xilinx, Inc. 2100 Logic Drive, San Jose, CA 95124.

* cited by examiner

*Primary Examiner*—Rexford Barnie
*Assistant Examiner*—Jason Crawford
(74) *Attorney, Agent, or Firm*—W. Eric Webostad

(57) ABSTRACT

Bidirectional register segmented data busing and addressing for such busing is described. A segmented databus includes data register segments coupled to one another via respective databus segments. Bidirectional drivers are coupled between the data register segments and the databus segments associated therewith. The bidirectional drivers are configurable for driving information along the segmented databus, wherein the databus segments are for both read and write busing.

18 Claims, 12 Drawing Sheets

US 7,233,169 B1

BIDIRECTIONAL REGISTER SEGMENTED DATA BUSING

FIELD OF THE INVENTION

One or more aspects of the invention relate generally to integrated circuits and, more particularly, to a bidirectional register segmented databus and an address bus therefore.

BACKGROUND OF THE INVENTION

Programmable logic devices ("PLDs") are a well-known-type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAM"), multipliers, digital signal processing blocks ("DSPs"), processors, clock managers, delay lock loops ("DLLs"), and so forth. Notably, as used herein, "include" and "including" mean including without limitation.

One such FPGA, the Xilinx Virtex® FPGA, is described in detail in pages 3–75 through 3–96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124. Young et al. further describe the interconnect structure of the Virtex FPGA in U.S. Pat. No. 5,914,616 B1, issued Jun. 22, 1999 and entitled "FPGA Repeatable Interconnect Structure with Hierarchical Interconnect Lines".

Another such FPGA, the Xilinx Virtex®-II FPGA, is described in detail in pages 33–75 of the "Virtex-II Platform FPGA Handbook", published December, 2000, available from Xilinx, Inc., 2100 Logic Drive, San Jose, Calif. 95124. And yet another such FPGA, the Xilinx Virtex-II Pro™ FPGA, is described in detail in pages 19–71 of the "Virtex-II Pro Platform FPGA Handbook", published Oct. 14, 2002 and available from Xilinx, Inc., 2100 Logic Drive, San Jose, Calif. 95124.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable. For purposes of clarity, FPGAs are described below though other types of PLDs may be used.

Heretofore, unidirectional segmented data busing was employed in FPGAs. However, this meant that two separate buses for reading and writing were used. This consumes a significant amount of semiconductor area. Accordingly, it would be desirable and useful to provide segmented data busing that uses less busing resources.

SUMMARY OF THE INVENTION

One or more aspects of the invention generally relate to integrated circuits and more particularly, to a bidirectional register segmented databus and an address bus therefore. An aspect of the invention is a segmented databus which includes data register segments coupled to one another via respective databus segments. Bidirectional drivers are coupled between the data register segments and the databus segments associated therewith. The bidirectional drivers are configurable for driving information along the segmented databus, wherein the databus segments are for both read and write busing.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items, however, in alternative embodiments the items may be different.

Figure 1:
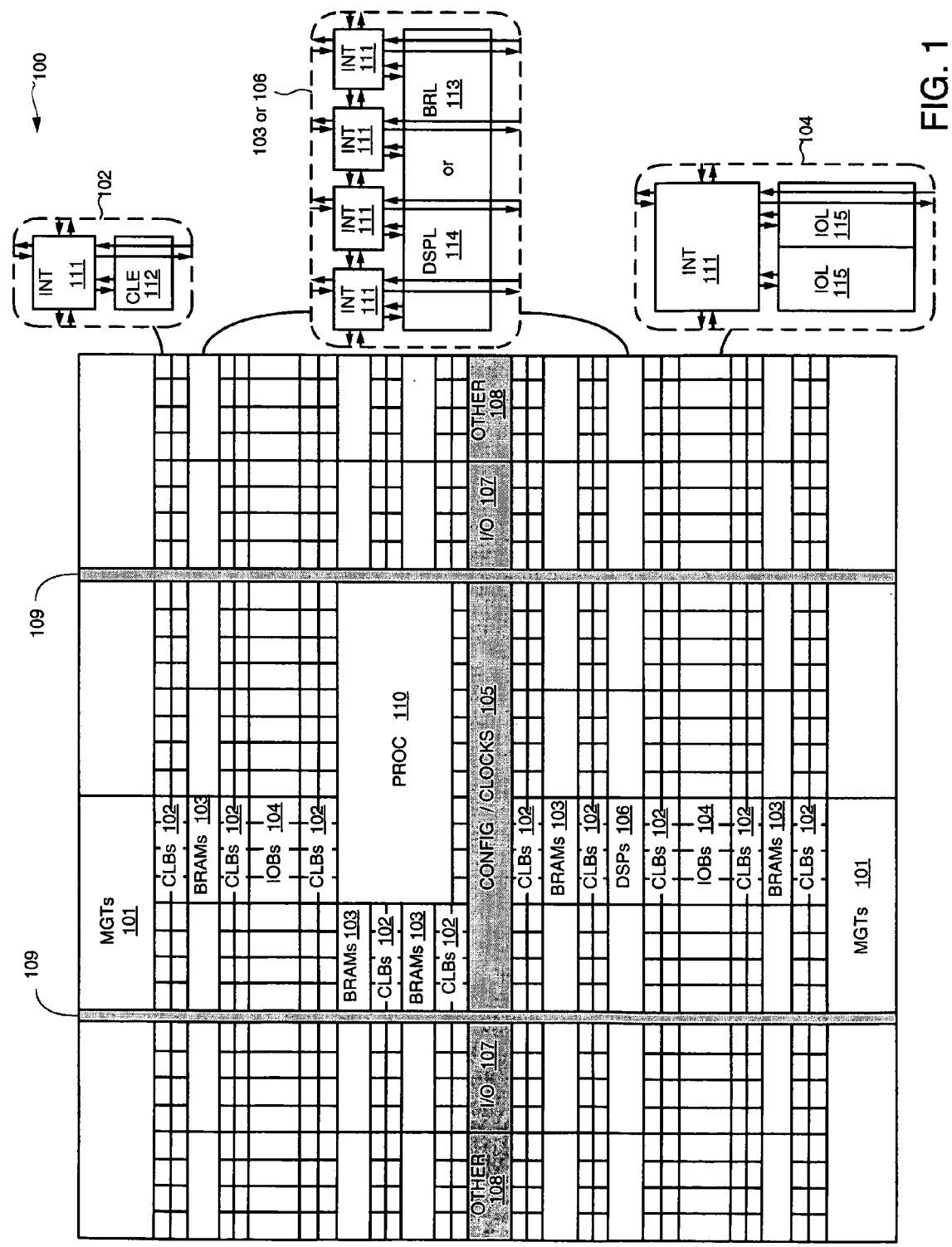
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. FPGA 100 may be used to implement system 100 of FIG. 1.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. Additional details regarding a columnar architected FPGA may be found in a co-pending patent application, namely, U.S. patent application Ser. No. 10/683,944, entitled "Columnar Architecture" by Steve P. Young, filed Oct. 10, 2003, which is incorporated by reference herein in its entirety.

FPGA 100 illustratively represents a columnar architecture, though FPGAs of other architectures, such as ring architectures for example, may be used. Moreover, it should be understood that FIG. 1 may be associated with a logic plane of FPGA 100, and that there is another plane, namely a configuration plane, of FPGA 100.

Figure 2A:
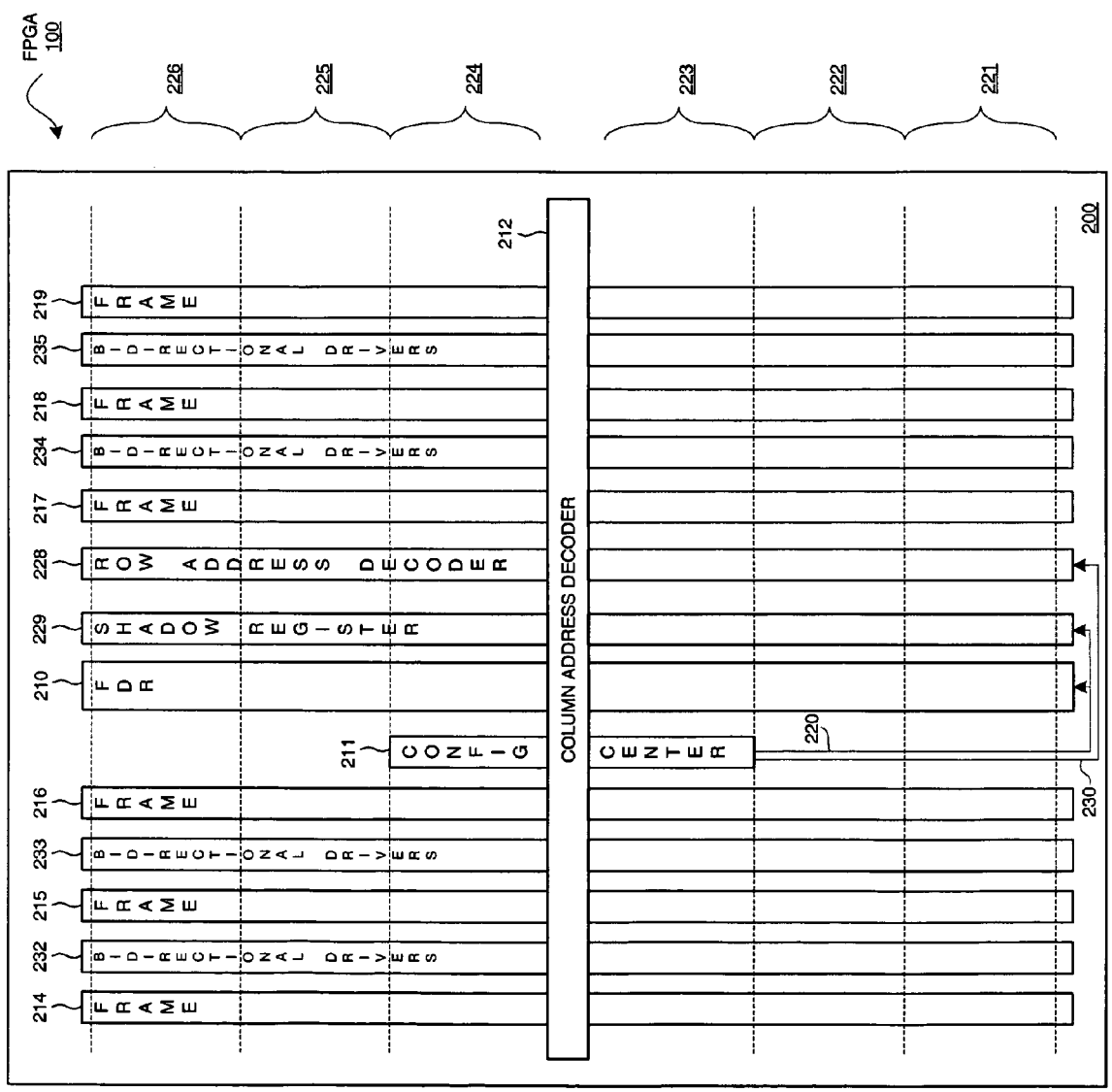
FIG. 2A is a simplified block diagram depicting an exemplary embodiment of a frame arrangement for a configuration plane of an FPGA.

FIG. 2A is a simplified block diagram depicting an exemplary embodiment of a frame arrangement for a configuration plane 200 of an FPGA 100. Configuration plane 200 includes rows 221 through 226, configuration memory frames ("frames") 214 through 219, bidirectional drivers 232 through 235, configuration center control logic 211, frame data register ("FDR") 210, shadow register 229, row address decoder 228, and column address decoder 212. In this exemplary embodiment of configuration plane 200, a centralized column address decoder 212 is illustratively shown.

Figure 2B:
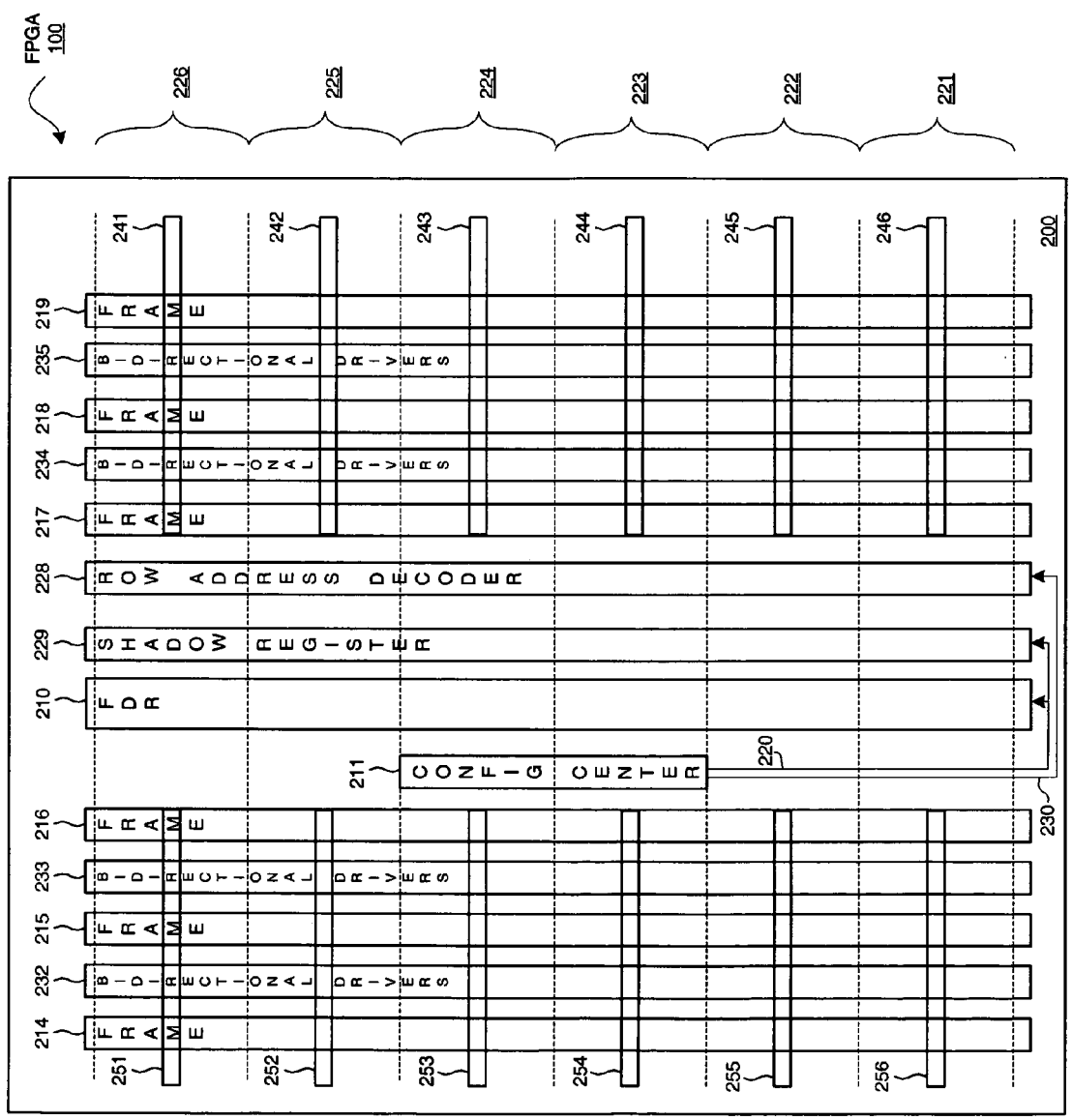
FIG. 2B is a simplified block diagram depicting an alternate exemplary embodiment of the configuration plane of FIG. 2A.

In FIG. 2B, there is shown a simplified block diagram depicting an alternate exemplary embodiment of configuration plane 200 of FIG. 2A. In this exemplary embodiment of configuration plane 200, column address decoder 212 of FIG. 2A is decentralized into respective sections for each row 221 through 226. For example, to the right of FDR 210 are column address decoders 241 through 246 respectively for rows 226 through 221 and to the left of FDR 210 are column address decoders 251 through 256 respectively for rows 226 through 221.

Figure 2C:
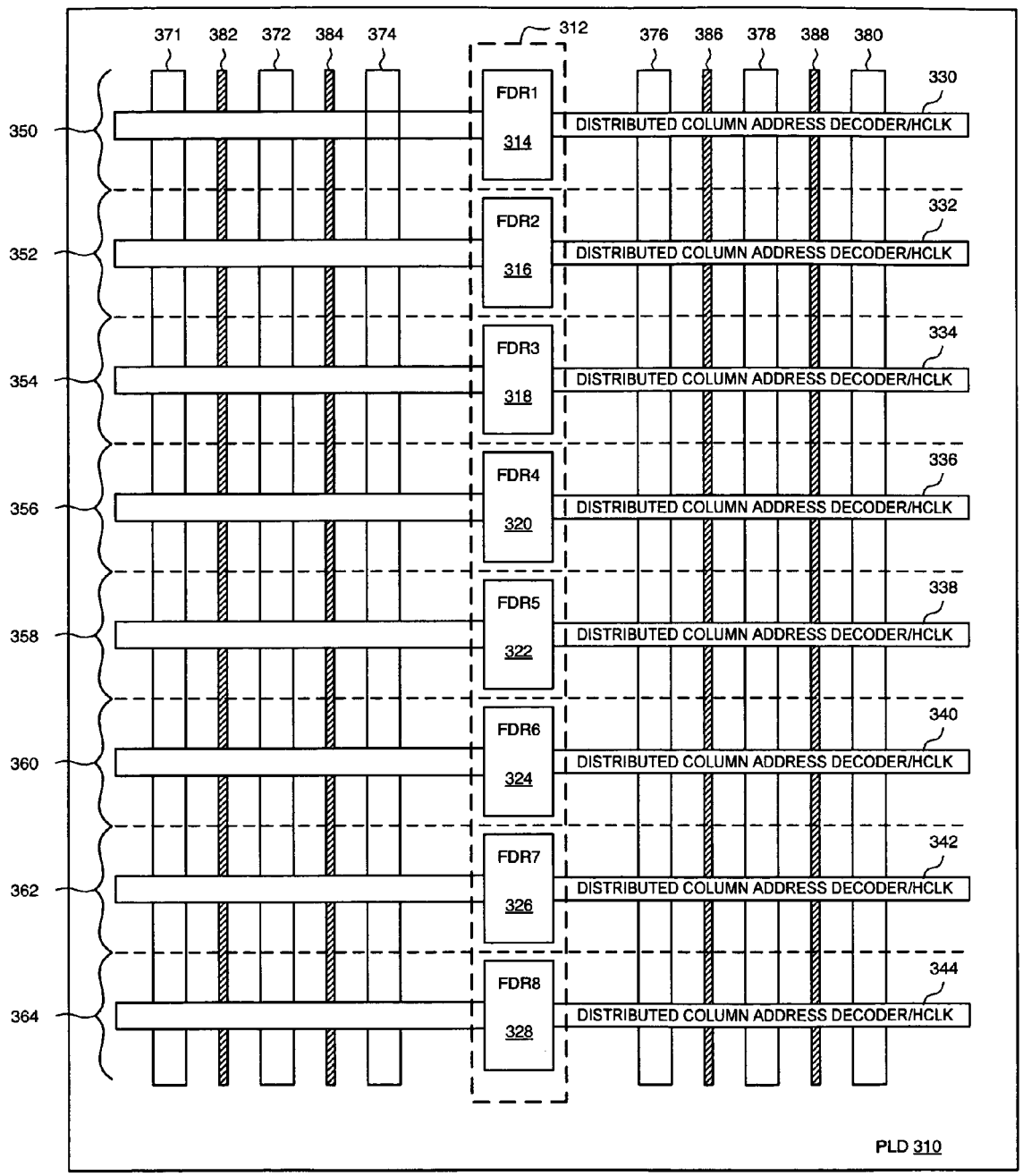
FIG. 2C is a simplified diagram of part of an exemplary embodiment of a configuration structure for a programmable logic device.

Continuing the embodiment of segmentation by rows for column address decoding, FIG. 2C is a simplified diagram of part of an exemplary embodiment of a configuration structure for a PLD 310. The configuration structure includes part of a two-dimensional configuration memory array of configurable memory cells. The memory array arranged in a series of columns 371, 372, 374, 376, 378, and 380 and a series of rows 350, 352, 354, 356, 358, 360, 362, and 364. Each column includes one or more sub-columns of memory cells, where a sub-column stores a fixed frame of configuration data and has a minor address. The column has a major address. Hence the column address for a fixed frame may include a column type, major address, and minor address as in conventional FPGAs. Further description of major and minor column addressing is found in Xilinx Application Note, entitled "Virtex Series Configuration Architecture User Guide" from Xilinx, Inc. of San Jose, Calif., XAPP151, Mar. 24, 2003. Interposed between the columns 371 through 380 are dataline drivers or repeater circuits 382, 384, 386, and 388.

Each of the rows 350 through 364 includes FDRs ("FDR1" through "FDR8") 314, 316, 318, 320, 322, 324, 326, and 328, collectively labeled FDR 312, and distributed column address decoder/HCLK rows 330, 332, 334, 336, 338, 340, 342, and 344, respectively. For example, to configure column 371 in row 352, bit stream data is first sent to FDR2 316 (serially or in parallel or a combination thereof) from the configuration center (not shown). Next, the data in FDR2 316 is transferred to the configuration memory cells in column 371 in row 352. The dataline drivers in columns 382 and 384 will restore the digital bit stream data as it moves across row 352 from FDR2 316 to column 371.

For reading back the configuration memory cell data in column 371 of row 352, the data is sent back in parallel to FDR2 316 from column 371 of row 352 and then read (serially or in parallel or a combination thereof) from FDR2 316 to the configuration center (not shown).

Figure 2D:
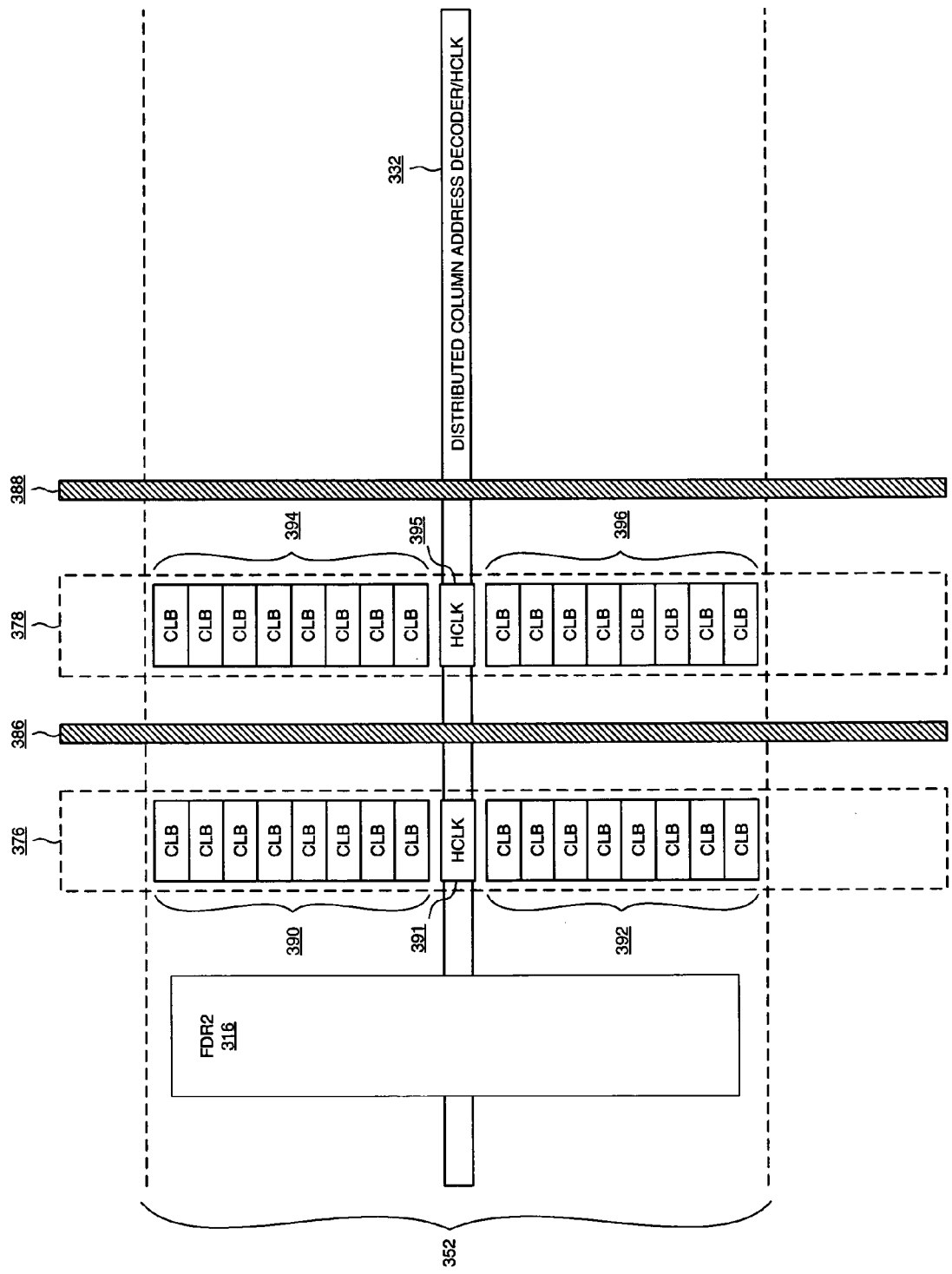
FIG. 2D is a detailed diagram of part of an exemplary embodiment of a row of FIG. 2C.

FIG. 2D is a detailed diagram of part of an exemplary embodiment of row 352 of FIG. 2C. A portion of columns 376 and 378 of row 352 are shown in more detail. Column 376 of row 352 may include a first block of configuration memory cells for eight Configuration Logic Blocks ("CLBs") 390, an HCLK block 391, and eight more CLBs 392. Similarly, column 378 of row 352 may include a second block of configuration memory cells for eight CLBs 394, an HCLK block 395, and eight more CLBs 396. CLBs are well-known and are described in the Virtex-II Pro Platform FPGA Handbook by Xilinx, Inc. of San Jose, Calif., October 2002. HCLK blocks 391 and 395 and HCLK row 332 are described in co-pending U.S. patent application Ser. No. 10/836,722 entitled "A Differential Clock Tree in an Integrated Circuit" by Vasisht M. Vadi, et. al, filed Apr. 30, 2004. In one example, the 16 CLBs are programmed by 40 words of configuration data. At 32 bits per word, there are 1280 configuration memory cells. In this example, HCLK blocks 391 and 395 each have 16 memory cells. FDR2 316 has 41 words (at 32 bits per word) or 1312 bits for a fixed frame, which includes 32 bits for the HCLK block even though only 16 bits are used.

Figure 2E:
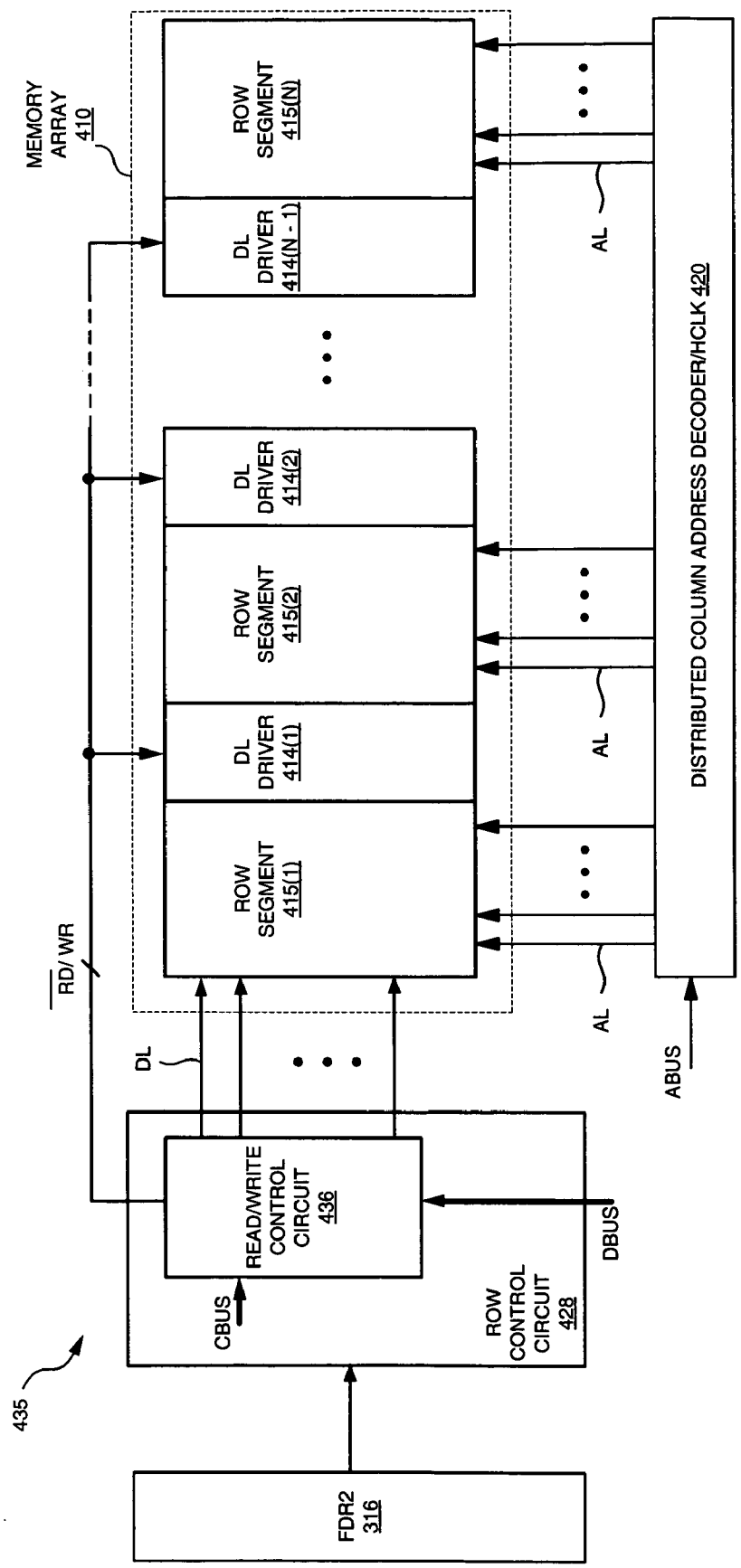
FIG. 2E is more detailed diagram of a part of an exemplary embodiment of a row coupled to a frame data register segment.

FIG. 2E shows a more detailed block diagram 435 of a part of an exemplary embodiment of row 352 coupled to FDR2 316. Notably, shadow registers, described elsewhere herein, may be coupled between FDR2 316 and row control circuit 428. Block diagram 435 shows a memory array 410, a distributed column address decoder/HCLK circuit ("address decoder") 420, and row control circuit 428 having a read/write control circuit 436. For some embodiments, the memory cells are SRAM cells, although other memory cells, both volatile and/or non-volatile (one time or many time programmable) can be used.

With reference to FIGS. 2C, 2D, and 2E, block diagram 435 shows the top half of row 352, where address decoder 420 corresponds to HCLK row 332, row segments 415(1) and 415(2) correspond to CLBs 390 and 394, respectively, and dataline ("DL") drivers 414(1) and 414(2) correspond to parts of dataline driver columns 386 and 388, respectively. Memory array 410 has sub-rows of row 352, where each sub-row is connected to read/write control circuit 436 via a corresponding dataline pair DL, and each column in memory array 410 is connected to address decoder 420 via a corresponding address line AL. Address decoder 420 is well-known, and includes circuitry to select one of address lines AL in response to an address provided on an address bus ABUS. Read/write control circuit 436 controls read, write, and test operations for memory array 410, and is coupled to a data bus DBUS and to a control bus CBUS. DBUS provides write configuration data from FDR2 316, or its corresponding shadow register, to memory array 410 and routes read configuration data from memory array 410 to FDR2 316, or its corresponding shadow register, via row control circuit 428, which includes read/write control circuit 436. CBUS provides various control signals to read/write control circuit 436.

CBUS includes control signals such as a power-on reset signal POR, a pre-charge signal PCH, a pre-discharge signal PDCH, a test signal TEST, and a write control signal WR. Further details on these CBUS signals are described in co-pending, commonly assigned U.S. patent application Ser. No. 10/796,750 entitled "Segmented Dataline Scheme in a Memory with Enhanced Full Fault Coverage Memory Cell Testability," by Vasisht M. Vadi, et al., filed Mar. 8, 2004, which is herein incorporated by reference.

Row circuit 428 gates (via AND gates) PCH, PDCH, TEST, and WR with a bit of the row address (row_addr) signal (not shown) before these signals go to control circuit 436. The row address signal is produced by the configuration logic in the configuration center and is the address of the row the fixed frame(s) are written to. In one embodiment the row_addr signals are a one-hot signal similar to, but different from, the fdr_addr signal. Thus, when row_addr is asserted for a row, reads to and writes from one or more columns in the row are allowed, i.e., the control signals PCH, PDCH, TEST, and WR are allowed to pass through the one or more AND gates.

As illustrated in FIG. 2E, the sub-rows of memory array 410 are divided into a plurality of row segments 415(1)–415(n), each of which can include any suitable number of memory cells. For some embodiments, the row segments include the same number of memory cells, while in other embodiments the row segments include different numbers of memory cells. Each row segment 415(1) through 415(n) includes an associated dataline segment to which the memory cells therein are connected. For simplicity, the dataline segments are not shown in FIG. 2E. Dataline drivers 414(1) through 414(n-1) are provided to selectively buffer signals between dataline segments in adjacent row segments 415 in response to read and write control signals. During write operations, dataline drivers 414 propagate write data in a first direction from read/write control circuit 436 along adjacent dataline segments to selected memory cells, while during read operations dataline drivers 414 propagate read data in a second direction from selected memory cells along adjacent dataline segments to read/write control circuit 436. In particular, using dataline drivers 414 rather than duplicating read/write control circuit 436 to drive the segments requires less area. Further details are described in co-pending, commonly assigned U.S. patent application Ser. No. 10/796,750 filed Mar. 8, 2004 entitled "Segmented Dataline Scheme in a Memory with Enhanced Full Fault Coverage Memory Cell Testability," by Vasisht M. Vadi, et al., which is herein incorporated by reference.

Additional details regarding the embodiments illustratively shown in FIGS. 2C, 2D, and 2E may be found in a co-pending application entitled "A Method and System for Configuring an Integrated Circuit," by Vasisht M. Vadi, et al., assigned application Ser. No. 10/970,964, filed Oct. 22, 2004, which is incorporated by reference herein in its entirety.

Figure 3A:
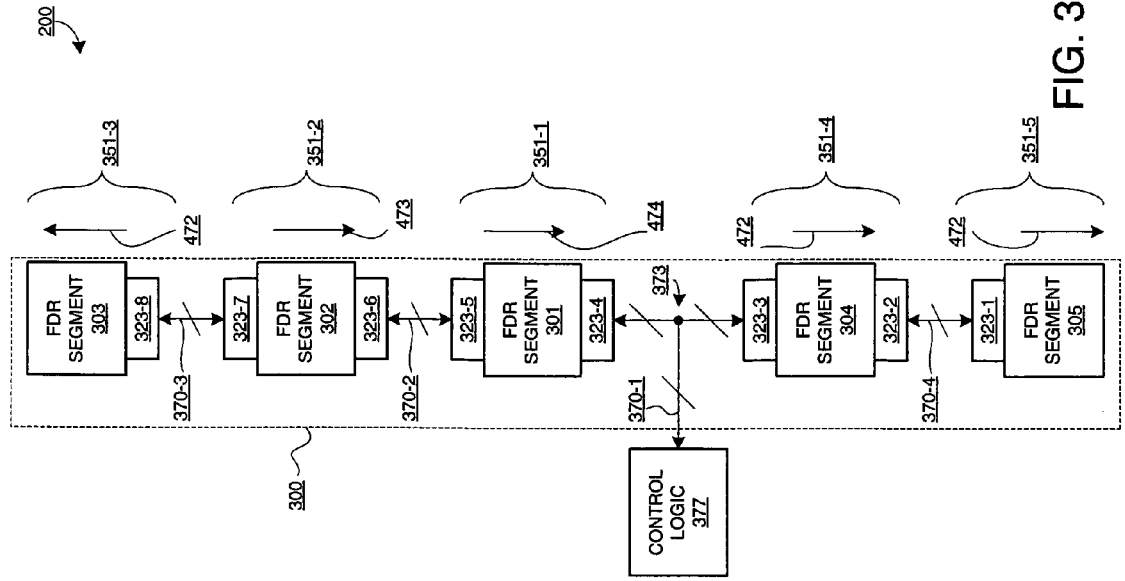
FIG. 3A is a simplified block diagram depicting an exemplary embodiment of a bidirectional segmented frame data register ("FDR") databus of a configuration plane for a write operation.

With renewed reference to FIGS. 2A and 2B, configuration plane 200 is further described in FIG. 3A, which is a simplified block diagram depicting an exemplary embodiment of a bidirectional segmented FDR databus 300 of configuration plane 200. Control logic 377, which in this embodiment may be configuration center logic 211, is coupled to FDR segments 301 through 305 of FDR 210 of FIG. 2A or 2B. Control logic 377 is coupled to FDR segments 301 through 305 via respective segmented databus sections 370-1 through 370-4, hereinafter collectively and singly referred to as segmented databus 370. Though in this example there are five FDR segments, it should be appreciated that fewer or more FDR segments may be used. FDR segments 301 through 305 are respectively associated with rows 351-1 through 351-5, which may be rows 221 through 226, respectively. In this embodiment, segmented databus 370 is 32 bits wide. Of course, the width of segmented databus 370 may be fewer or more than 32 bits. It should be appreciated that segmented databus 370 is both a read and a write bus. Thus, having separate read and write buses is avoided.

Having a unified read/write bus for segmented databus 370, which may be fewer or more than 32 bits wide, is facilitated by bidirectional drivers 323-1 through 323-8. For example, FDR segment 301 has bidirectional drivers 323-4, namely a bidirectional driver for each databus line, coupled to segmented databus 370-1 on a side coupled to control logic 377 and has bidirectional drivers 323-5 coupled to segmented databus 370-2 on a side coupled to FDR segment 302. In this example, each FDR segment 301 through 305 includes at least one set of bidirectional drivers coupled to a section of segmented databus 370.

For a write operation, control logic 377 provides information to segmented databus 370. In this example, write data is initially provided from control logic 377 to section 370-1 of segmented databus 370 for distribution to FDR segments 301 and 304. For the chain of FDR segments 301 through 303, write data is distributed up the chain of FDR segments, as indicated by arrows 470, in part via sections 370-2 and 370-3 of segmented databus 370. For the chain of FDR segments 304 through 305, write data is distributed up the chain of FDR segments, as indicated by arrows 471, in part via section 370-4 of segmented databus 370. It should be noted that for each row 351-1 through 351-5, information is propagated away from a central location 373 associated with where control logic 377 is coupled to section 370-1 of bidirectional segmented databus 370. Write data is propagated up and down the chain or chains of FDR segments, where propagation in each direction is away from control logic 377.

Notably, write data may be written to FDR 210 for writing to a frame, for example frame 214. A frame may include an array of configuration random access memory ("RAM") cells. During a conventional write operation, write data is loaded into FDR 210 for writing in massive parallel to a frame, for example frame 214. In an embodiment of an FPGA 100, a frame may be 1312 rows by 1 column of configuration RAM cells thus capable of storing 1312 bits. Frame length depends on configuration of FPGA 100. Notably, frames may be any of a variety of lengths, including less than 1000 bits, from 1000 bits to 10,000 bits, and over 10,000 bits. However, as noted above, for a segmented FDR 210, each FDR segment 301 through 305 is associated with a respective row 351-1 through 351-5. Each row 351-1 through 351-5 is associated with a portion of the rows of a frame for single column frame architecture. Thus, for example, FDR segment 301 is associated with a respective portion of each frame associated with row 351-1. Assuming a single column frame architecture, a column address may be used to select a frame, a row address may be used to select a portion of the rows of the frame, and an FDR address may be used to select an FDR segment to write or read information to or from the selected portion of the rows of the frame. Thus, for example, a row address signal 230 may be provided from configuration center control logic 211 to row address decoder 228 to select a row of rows 221 through 226, and an FDR address signal 220 may be provided to FDR 210 to select an FDR segment. A column address signal (not shown) may be provided to column address decoder 212, or to a column address decoder associated with the selected row and frame of column address decoders 241 through 246 and 251 through 256. Alternatively, multiple frames, for example frames 214 through 216, associated with a row, for example row 226, may be written to or read from an associated FDR segment. Shadow register 229 may be used to facilitate use of FDR 210 while reading data from or writing data to one or more frames. Notably, shadow register 229, which may be implemented with flip-flops, may be segmented and addressed like FDR segments and thus may be responsive to FDR address signaling 220.

Continuing the above example, a write may be done in 1312 bit parallel for FDR 210 fully loaded with write data, though such write data is shifted into FDR 210 32 bits at a time from control logic 377 and provided to respective FDR segments responsive to addressing. The bit width for communication between an FDR segment and a frame will be less than the total frame length of 1312. Thus, for example, a frame length may be evenly or unevenly divided among the FDR segments. Moreover, rather than a massive parallel transfer of data from FDR 210 to shadow register 229 and then to a frame, such as frame 214, multiple parallel transfers may be made from one or more FDR segments to one or more frames, such as frames 214, 215, and 216, for a block of configuration data stored across more than one frame. The reverse direction of a write operation is used for a read operation. For purposes of clarity, additional details regarding operation of FPGA 100 are omitted.

Figure 3B:
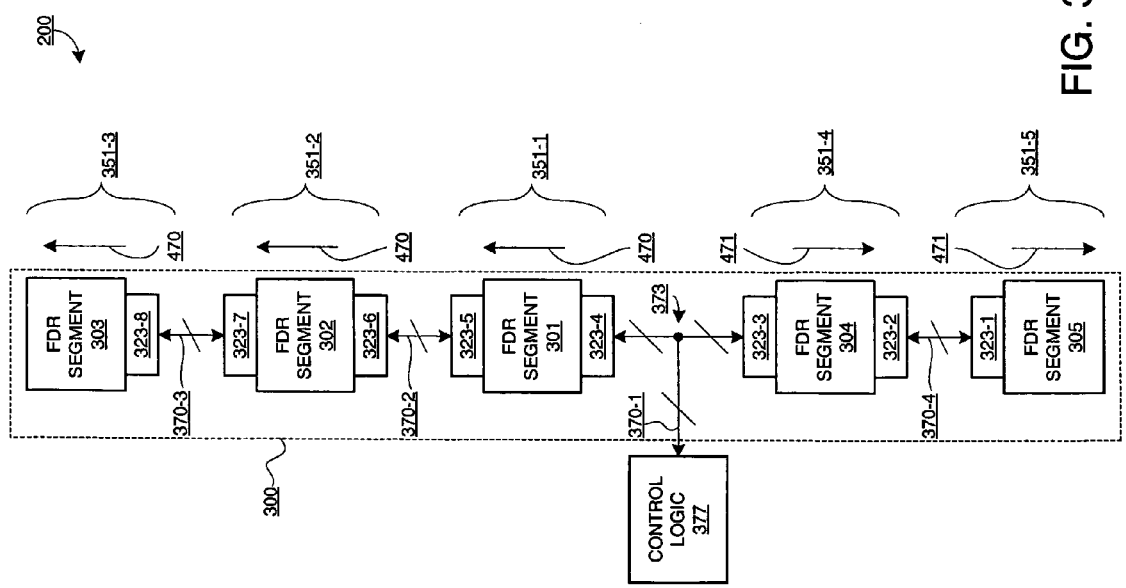
FIG. 3B is a simplified block diagram depicting an exemplary embodiment of the bidirectional segmented FDR databus of FIG. 3A for a read operation.

With continuing reference to FIGS. 2A and 2b, FIG. 3B is a simplified block diagram depicting an exemplary embodiment of the bidirectional segmented FDR databus 300 of configuration plane 200 of FIG. 3A for a read operation. In this embodiment, row 351-2 has been selected for a read operation for purposes of explanation and not limitation, as any row may be selected for readback of one or more frames associated therewith. Accordingly, FDR segment 302 having received configuration data, such as from a selected frame of frames 214 through 219, will be read back to control logic 377. Notably, it should be appreciated that for FDR segments 303, 304, and 305, information read is propagated away from central location 373 or more generally away from control logic 377, as indicated by arrows 472. However, for the selected row 351-2, FDR segment 302 propagates information toward control logic 377 as indicated by arrow 473.

Read data, such as from rows of a frame, is registered in FDR segment 302. Read data in FDR segment 302 is propagated along bidirectional databus section 370-2 of segmented databus 370 to FDR segment 301, as indicated by arrow 473. This read data is propagated from FDR segment 301 to control logic 377 via section 370-1 of segmented databus 370, as indicated by arrow 474. In this manner, data from a selected row may be read back via a selected FDR segment to control logic 377, including each intervening FDR segment therebetween. In this example, FDR segments 303 through 305 are in a same state as for a write operation, where arrows 472 indicate propagation of information away from control logic 377 up and down the FDR segmented chain. In contrast, FDR segments 301 and 302 are in a state for a read operation. Thus, bidirectionality of segmented databus 370 using bidirectional/tristateable drivers facilitates using the same busing for both read and write operations. As used herein, the term "tristate" and variations thereof are used to mean a sufficiently high impedance state to prevent data from being communicated.

Figure 4:
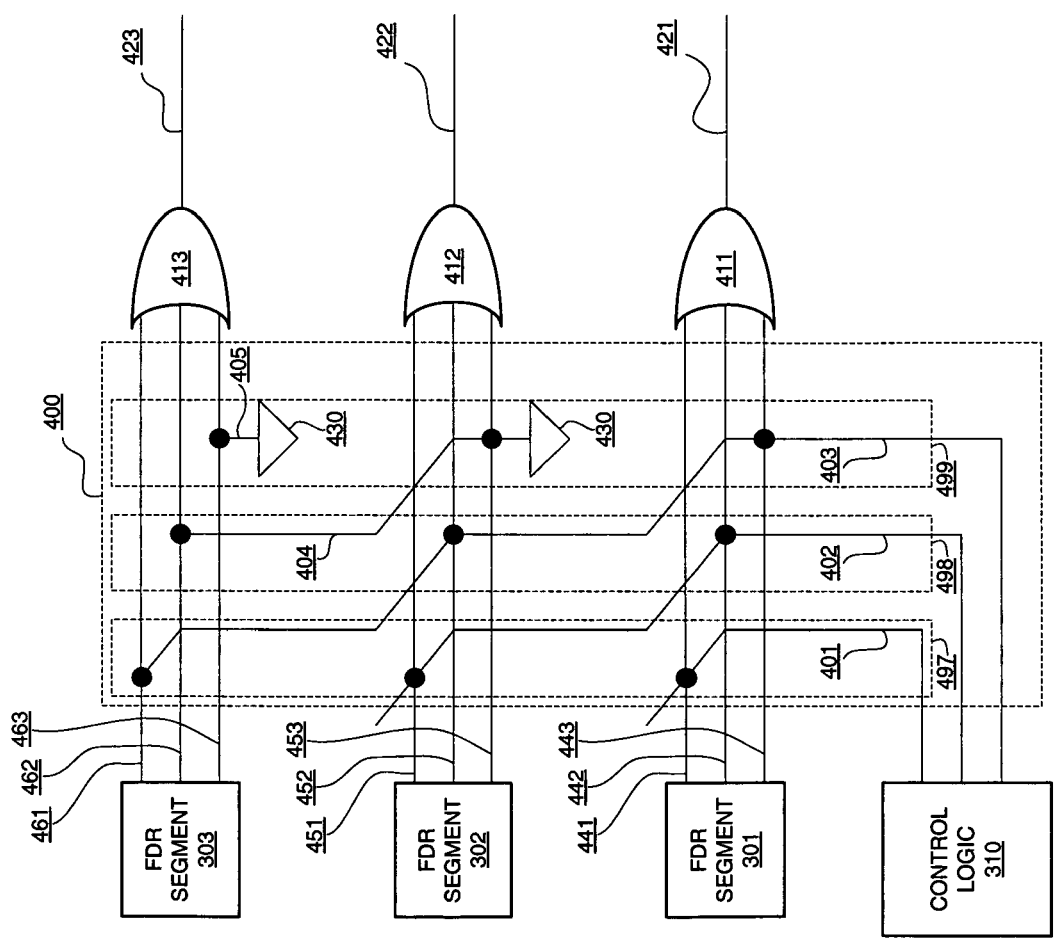
FIG. 4 is a block/schematic diagram depicting an exemplary embodiment of an address bus for selecting configuration state of an FDR segment, such as for either a read or a write operation.

FIG. 4 is a block/schematic diagram depicting an exemplary embodiment of an address bus 400 for selecting configuration state of an FDR segment, such as for either a read or a write operation. Notably, though three FDR segments 301 through 303 are illustratively shown, it should be appreciated that fewer or more FDR segments may be used. Furthermore, though only an upper portion of a segmented FDR, such as of FIGS. 3A and 3B, is illustratively shown in FIG. 4, it should be appreciated that the following description equally applies to the bottom portion of such segmented FDR of FIGS. 3A and 3B. Moreover, address lines 401 through 403 are referred to as the position for contacts, as indicated by respective dashed boxes 497 through 499 within address bus 400, though such address lines may be rotated or shifted out, as described below.

For three FDR segments 301 through 303, each FDR segment has three contact lines associated with it for input to control logic. In this example, FDR segment 301 has contact lines 441 through 443 for input to OR gate 411; FDR segment 302 has contact lines 451 through 453 for input to OR gate 412; and FDR segment 303 has contact lines 461 through 463 for input to OR gate 413. These contact lines have an order, such as 0 through 2. Notably, there is a one-to-one correspondence between contact lines and FDR segments.

In this exemplary embodiment, an initial FDR segment 301 has none of its address lines 401 through 403 coupled to ground. However, each FDR segment in a chain removed from control logic 377 by at least one FDR segment has at least one FDR segment address line coupled to ground. In this exemplary embodiment, the most significant bit ("MSB") of each FDR segment beyond a first FDR segment in a chain, such as FDR segment 301 in this example, is coupled to ground 430.

Address lines 401 through 403 are respectively coupled to FDR segment 301 contact lines 441 through 443. Address lines are shifted one position to the left for each subsequent FDR segment after FDR segment 301. Thus, for example, FDR segment 302 contact lines 451 through 453 are respectively coupled to address lines 402 through 404, where address line 402 is shifted into the position of address line 401, address line 403 is shifted into the position of address line 402, and an address line 404 in initiated to substitute for address line 401, the latter of which is shifted out. This initiation of address line 404 is in effect a rotation of positions 497 through 499 with respect to initial positions of address lines 401 through 403, where a new address line coupled to a fixed logic value is initiated. The newly initiated address line 404 is in this example coupled to ground 430. FDR segment 302 contact line 453 is thus coupled to ground 430.

Continuing the example, FDR segment 303 contact lines 461 through 463 are respectively coupled to address lines 403 through 405, where address line 403 is shifted into the original position of address line 401, address line 404 is shifted into the original position of address line 402, and an address line 405 is initiated to substitute for address line 402, which is shifted out. This initiation of address line 405 is in effect a rotation of positions 497 through 499 serially for this FDR segment progression, where a new address line coupled to a fixed logic value is initiated. The newly initiated address line 405 is in this example coupled to ground 430. FDR segment 303 contact line 463 is thus coupled to ground 430. It should be appreciated that subsequent address lines may be shifted and added/rotated in like manner. Notably, the address lines need not be physically shifted as indicated, but merely be coupled to a different order of contact line.

With address bus 400, bidirectional driver configuration for either a read or a write operation is responsive to a row address, such as a row address for a row of rows 351-1 through 351-3. For example, for a read operation for a read of FDR segment 302, an FDR segment address may be output from control logic 377, such as on: address line 401 as a logic low level; address line 402 as a logic high level; and address line 403 as a logic low level. Output 421 of OR gate 411 will be a logic high responsive to the logic high level on address line 402 coupled to contact line 442, where contact lines 441 and 443 are respectively coupled to the logic low levels on address lines 401 and 403. Output 422 of OR gate 412 will also be a logic high responsive to the logic high level on address line 402 coupled to contact line 451, where contact lines 452 and 453 are respectively coupled to the logic low levels on address lines 403 and 404. Output 423 of OR gate 413 will be a logic low level responsive to the logic low level on address lines 403 through 405 respectively coupled to contact lines 461 through 463. Notably, address lines 404 and 405 are coupled to ground, and thus each have a logic low level.

Thus, in this example, FDR segment 302 was selected for a read operation. Accordingly outputs 421 and 422, both being a logic high level, are used to cause information to be propagated in a direction toward a control logic 377 on segmented databus 370. In contrast, output 423 of OR gate 413, being a logic low level, is used to cause information to be propagated away from control logic 377 for a read operation. Outputs 421 through 423 may be provided as respective control signals to bidirectional drivers associated with an FDR segment. For example, for FDR segment 302, bidirectional drivers 323-6 and 323-7 of FIGS. 2A and 2B may be controlled responsive to output 422. For a write operation, a default control signal state to each bidirectional driver will be to provide a direction of propagation away from control logic 377, which in this example is a logic low level. This logic low level may thus be maintained, subject to an overriding control signal input as described for a read operation.

Thus, it should be understood that by shifting and adding address lines, where the MSBs of FDR address bits are successively grounded after an initial set of address bits, control signaling for bidirectional drivers may be generated responsive to an FDR segment address. By having at least two address bits or address lines with which segments drive other segments, each segment receives its own address and an address bit of an adjacent segment. These address bits allow a segment to determine whether it is in front of or behind an adjacent segment, with respect to direction of data propagation. Moreover, it should be understood that any location within bidirectional FDR segmented databus 300 may be accessed for a readback to control logic 377. Furthermore, it should be understood that any location within bidirectional FDR segmented databus 300 may be accessed for a write operation by propagating write data away from control logic 377. Moreover, though control logic 377 was used in this example, it should be understood that data may be controllably driven from one FDR segment to another in order to allow any FDR segment to write directly to any other FDR segment. In this embodiment of a direct write from FDR segment to FDR segment, additional address lines may be added for FDR segment to FDR segment direct writes apart from a readback to control logic 377. Thus, for example, a direct write may be done from FDR segment 303 to FDR segment 302 in FIG. 3B, where bidirectional drivers associated with FDR 301 are tristated to prevent data propagation to control logic 377.

Figure 5:
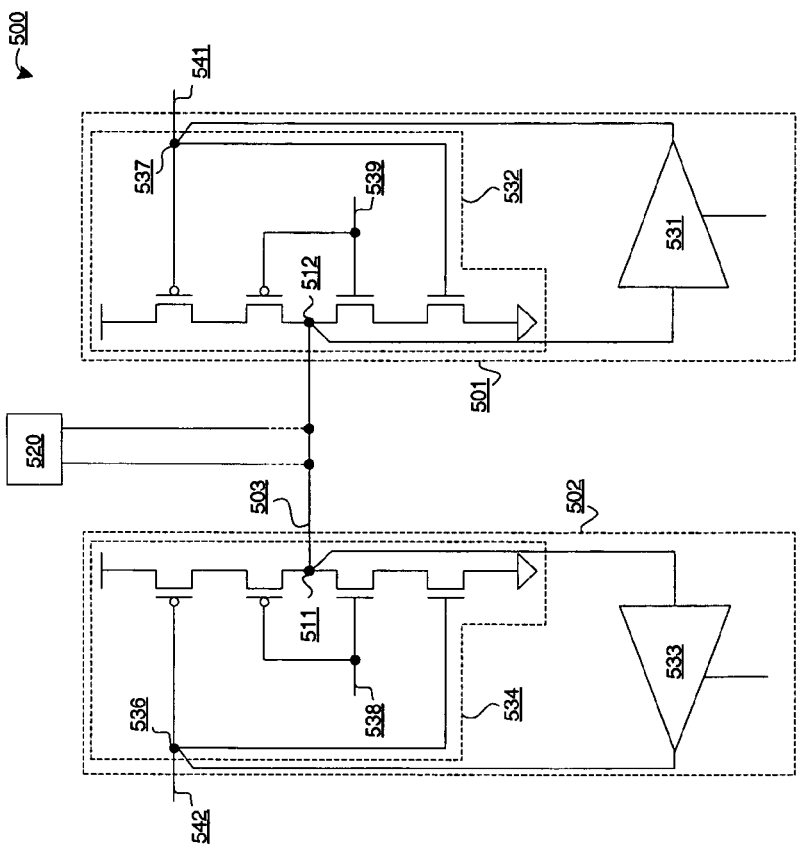
FIG. 5 is a schematic/block diagram depicting an exemplary embodiment of bidirectional drivers.

FIG. 5 is a schematic/block diagram depicting an exemplary embodiment of bidirectional drivers 500. Bidirectional drivers 500 include bidirectional driver 501 and bidirectional driver 502. Bidirectional driver 501 may be a bidirectional driver of bidirectional drivers 323-6 of FIG. 3A, for example, and bidirectional driver 502 for example may be a bidirectional driver of bidirectional drivers 323-5 of FIG. 3A. A databus line 503, which may be a databus line of databus 370-2 of FIG. 3A, couples input/output nodes 511 and 512 respectively of bidirectional drivers 502 and 501. Notably, bidirectional drivers 501 and 502 may be configured for driving information in either direction, and such information may be pulled up to a logic high level for driving a logic high value, or pulled down to a logic low level for driving a logic low value.

Optionally, additional circuitry 520 may be coupled to databus line 501, as bidirectional drivers 502 and 501 may be controllably tristated. In this manner, additional circuitry 520 may utilize a segmented bidirectional databus to propagate data.

Bidirectional driver 501 includes two tristateable buffers 531 and 532 coupled in a loop with data input/output nodes 512 and 537. Bidirectional driver 502 includes two tristateable buffers 533 and 534 coupled in a loop with data input/output nodes 511 and 536. For example, data lines 542 and 541, which may be coupled to respective previous and subsequent databus lines via FDR segments, are coupled to respective input/output nodes 536 and 537 of bidirectional drivers 502 and 501. As previously mentioned with reference to FIG. 4, control signals may be output from OR gates. Continuing the above example, control signal 422 of FIG. 4 may be coupled to bidirectional driver 502, where control input signal 538 is responsive to control signal 422, such as for outputting information from bidirectional driver 502 ("forward direction"). Output provided from bidirectional driver 502 would then be forwarded to bidirectional driver 501 via databus line 503. Control input signal 539 may be responsive to control signal 421 of FIG. 4 to allow for inputting data to bidirectional driver 501 ("reverse direction"). Data line 541 may be coupled to another databus line via an FDR segment. Thus, for this example, a previous databus line would be coupled to node 536 from which information would be obtained and driven in a forward direction via bidirectional driver 502 to bidirectional driver 501, which would forward the information to a subsequent databus segment via output node 537. Notably, nodes 536 and 537 may be either input or output nodes depending on direction of propagation of information.

Accordingly, it should be understood that the entire databus may be driven from any segment along the chain. Moreover, control logic, which may be located at an end of or somewhere along the databus chain, may be used to drive data to any segment along the databus chain, and data may be read back to the control logic. Moreover, it should be understood that arbitrarily long databus chains are facilitated as the number of data buses in the databus chain may be incrementally increased. Although the above segmented data bus has been described with reference to an FPGA, an ASIC, or other integrated circuit, it should be understood that the above-described segmented data bus may be used for other bidirectional interconnect applications. Moreover, the above-described segmented data bus may be used in microchip-to-microchip communications, such as at a circuit board level, or large scale applications with databuses extending over longer distances than at a circuit board level. Thus, an address may be provided for any of: exclusive communication between FDR segments, communication between an FDR segment and control logic, communication from one integrated circuit to another, and communication from one circuit board to another circuit board.

Figure 6A:
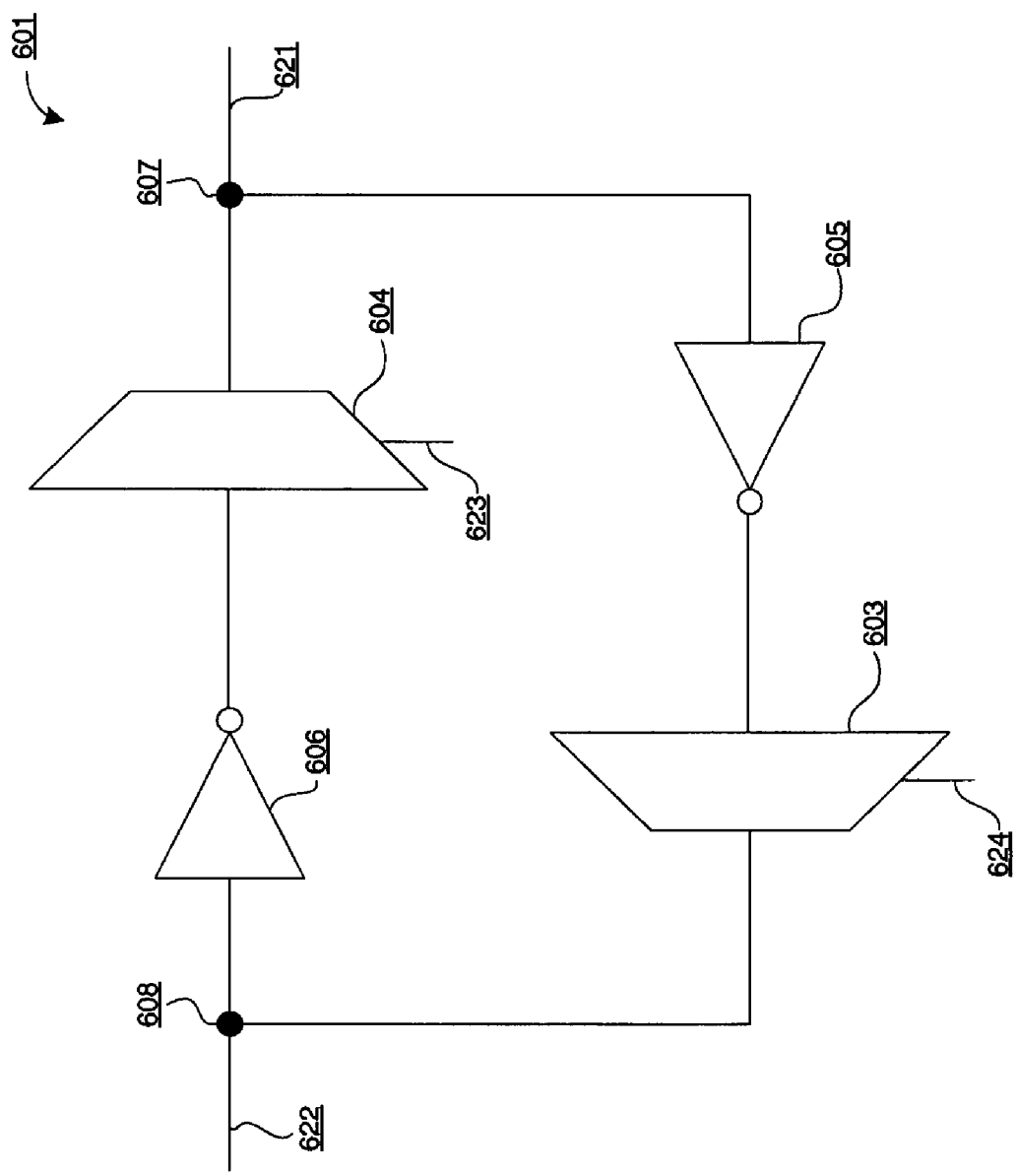
FIG. 6A is a schematic diagram depicting an exemplary alternative embodiment of a bidirectional driver.

FIG. 6A is a schematic diagram depicting an exemplary alternative embodiment of a bidirectional driver 601. Bidirectional driver 601 includes pass gate multiplexers 603 and 604, the inputs of which are provided from in-series inverters 605 and 606, respectively. Inputs to inverters 605 and 606 are respectively coupled to nodes 607 and 608. The output of multiplexer 604 is connected to node 607, and the output of multiplexer 603 is coupled to node 608. For example, an input data signal 621 may be input to node 607, which data is inverted by inverter 605. Output of inverter 605 is passed through pass gate multiplexer 603 responsive to control signal 624 set to allow passage through such multiplexer. Output of multiplexer 603 is provided to node 608 for output data signal 622. Multiplexer 604 is put in a tristate condition responsive to control signal 623 to prevent passage of data through such multiplexer.

Figure 6B:
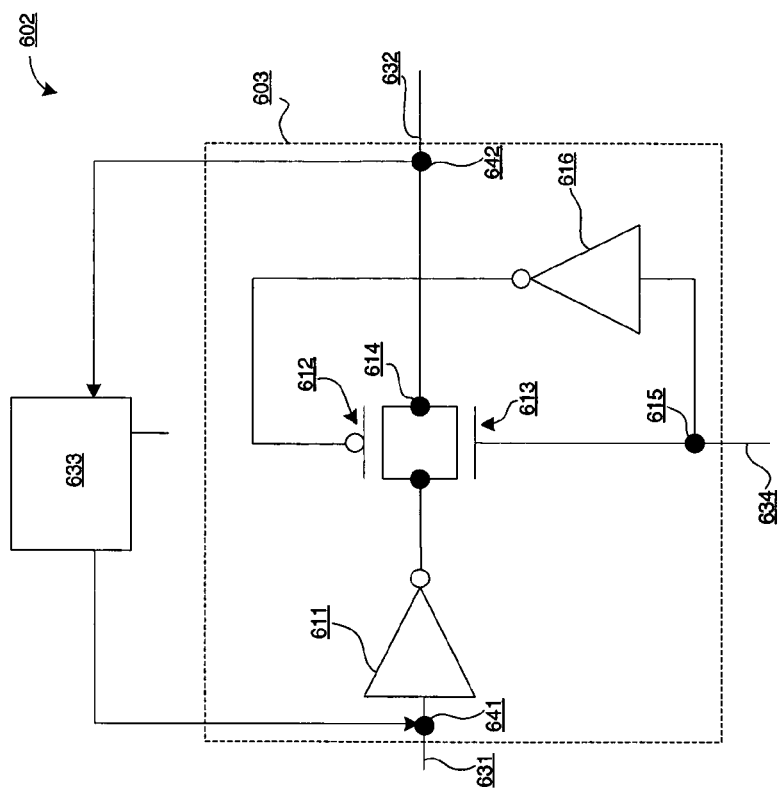
FIG. 6B is a schematic/block diagram depicting another exemplary alternative embodiment of a bidirectional driver.

FIG. 6B is a schematic/block diagram depicting another exemplary alternative embodiment of a bidirectional driver 602. Driver circuits 603 and 633 are coupled in a loop for bidirectional data propagation and with common input/output nodes 641 and 642, where each such driver circuit may be used to implement a half of bidirectional driver 602. Each of driver circuits 603 and 633 is the same circuit, so only driver circuit 603 is described in detail to avoid unnecessary repetition.

In FIG. 6B, a driver circuit 603 receives an input, such as an input data signal 631, to input/ouput node 641 for input to inverter 611, the output of which is coupled to a node coupled to source regions of p-type and n-type transistors coupled in source/drain parallel. P-type transistor 612 and n-type transistor 613 have their drain regions coupled to an output node 614. An input node 615 is coupled to a gate of n-type transistor 613 and to an input of inverter 616. Output of inverter 616 is used to gate p-type transistor 612 and thus is coupled to a gate of p-type transistor 612. Notably, node 615 is used to provide a control signal 634 to gates of n-type and p-type transistors 613 and 612 for configuring lower driver circuit 603 to either drive data or be in a tristate condition. Thus, input data signal 631 is inverted by inverter 611, the output of which passes through respective channels of transistors 612 and 613 as output signal 632 via input/output node 642.

Notably, bidirectional drivers 601 and 602 respectively in FIGS. 6A and 6B are coupled to databus lines, as previously described with reference to bidirectional driver 501 of FIG. 5A for example.

For bidirectional drivers described herein, there is a possibility that both driver circuit portions are placed via a control signal in a tristate, or non-data-driving, configuration. If both bidirectional driver circuit portions are effectively in a non-driving state, there is a possibility that a databus line coupled thereto could float. To prevent such floating, namely to hold a databus state in place, a relatively weak latch may be coupled to a databus line. By "relatively weak latch," it is meant that a driver circuit portion at either end of a databus line segment may override latched state of the latch, or half latch.

Figure 7B:
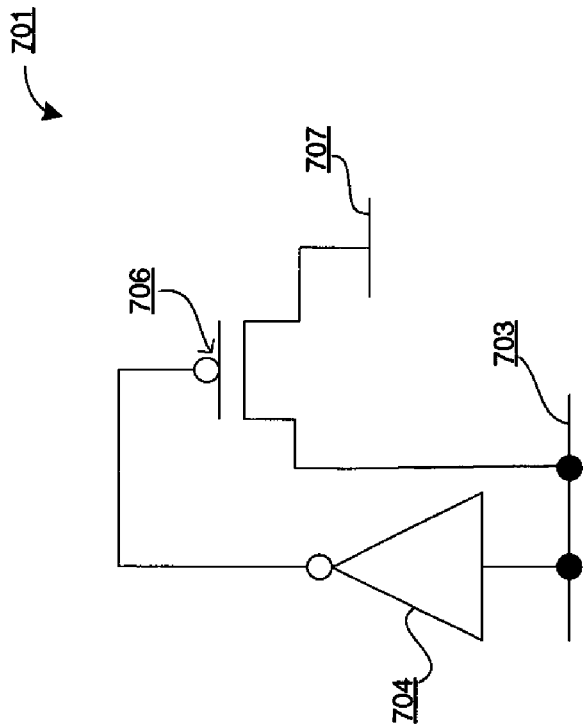
FIGS. 7A and 7B are schematic diagrams depicting respective exemplary embodiments of a latch and a half-latch, which may be coupled to a databus line.
Figure 7A:
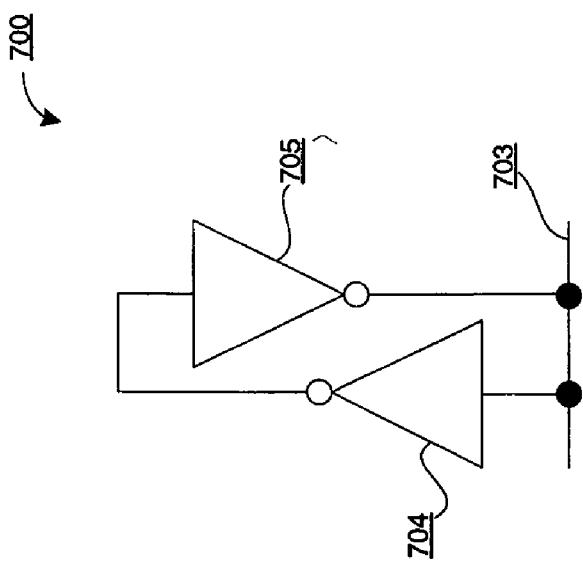

For example, FIGS. 7A and 7B are schematic diagrams depicting respective exemplary embodiments of a latch 700 and a half-latch 701, which may be coupled to a databus line 703. In FIG. 7A, latch 700 includes inverters 704 and 705 coupled in series in a closed loop where input to inverter 704 is coupled to databus line segment 703 and output of inverter 705 is also coupled to databus line segment 703.

In FIG. 7B, inverter 705 is replaced with a p-type transistor 706. P-type transistor 706 has its gate coupled to the output of inverter 704. A source region of p-type transistor 706 is coupled to a source voltage 707, and a drain region of p-type transistor 706 is coupled to databus segment 703. Latch 700 may be used to maintain state on a databus line segment 703 by weakly latching such state, or half-latch 701 may be used to maintain a logic level one on databus line segment 703.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A segmented databus comprising:
 data register segments coupled to one another, the data register segments coupled to one another via respective databus segments;
 bidirectional drivers coupled between the data register segments and the databus segments associated therewith, the bidirectional drivers configurable for driving information along the segmented databus, wherein the databus segments are for both read and write busing; and
 control logic coupled to a databus segment of the databus segments,
 wherein the bidirectional drivers are configured to propagate information along the segmented databus away from the control logic for a write operation.

2. A segmented databus comprising:
 data register segments coupled to one another, the data register segments coupled to one another via respective databus segments;
 bidirectional drivers coupled between the data register segments and the databus segments associated therewith, the bidirectional drivers configurable for driving information along the segmented databus, wherein the databus segments are for both read and write busing; and
 control logic coupled to a databus segment of the databus segments,
 wherein the bidirectional drivers are configured to propagate information along the segmented databus away from the control logic for a read operation for a first portion of the data register segments and toward the control logic for the read operation for a second portion of the data register segments.

3. The segmented databus according to claim 2, wherein the first portion of the data register segments are not selected for the read operation, and wherein the second portion of the data register segments are selected for the read operation.

4. A segmented databus comprising:
 data register segments coupled to one another, the data resister segments coupled to one another via respective databus segments;
 bidirectional drivers coupled between the data register segments and the databus segments associated therewith, the bidirectional drivers configurable for driving information along the segmented databus, wherein the databus segments are for both read and write busing; and
 control logic coupled to a databus segment of the databus segments,
 wherein the control logic is coupled to an address bus, the address bus having sets of address lines, the sets of address lines coupled to sets of ordered contact lines, wherein each set of the sets of address lines corresponds to a respective set of the sets of ordered contact lines, the sets of ordered contact lines corresponding to the data register segments.

5. The segmented databus according to claim 4, wherein address lines in the sets of address lines are shifted relative to coupling to ordered contact lines in the sets of ordered contact lines for each progression of the data register segments, and wherein an address line of the address lines is added to substitute for another address line of the address lines shifted out responsive to the progression of the data register segments.

6. The segmented databus according to claim 5, wherein the address line added is coupled to a fixed logic level.

7. The segmented databus according to claim 6, wherein the fixed logic level is associated with an electrical ground.

8. The segmented databus according to claim 7, wherein the sets of ordered contact lines are respectively coupled as inputs to OR gates.

9. The segmented databus according to claim 5, wherein the sets of ordered contact lines are coupled as sets of inputs to respective control gates, the control gates configured to provide respective control signal outputs.

10. The segmented databus according to claim 9, wherein a portion of the control signal outputs are responsive to a portion of an address provided to the address bus and responsive to the fixed logic level input to an associated portion of the control gates corresponding to a portion of the sets of ordered contact lines coupled to the fixed logic level and to the control gates.

11. The segmented databus according to claim 9, wherein the control signal outputs are respectively coupled to each set of the bidirectional drivers associated with a respective data register segment of the data register segments.

12. The segmented databus according to claim 11, wherein the bidirectional drivers are configured for a read operation responsive to the control signal outputs.

13. The segmented databus according to claim 12, wherein the control signals are generated responsive to an address provided to the address bus.

14. The segmented databus according to claim 13, wherein the address is a frame data register address, and wherein the data register segments are frame data register address segments.

15. The segmented databus according to claim 14, wherein the frame data register address segments are disposed in a programmable logic device.

16. The segmented databus according to claim 15, wherein the programmable logic device is a Field Programmable Gate Array.

17. The segmented databus according to claim 13, wherein the address is for communication from one integrated circuit to another integrated circuit.

18. The segmented databus according to claim 13, wherein the address is for communication from one of the data register segments to another of the data register segments.

* * * * *